(12) United States Patent
Mordkovich

(10) Patent No.: US 6,479,977 B1
(45) Date of Patent: Nov. 12, 2002

(54) AUTOMATIC ELECTRONIC LOAD PULL CIRCUIT FOR OSCILLATORS

(76) Inventor: Mikhail Mordkovich, 2906 Brighton 12$^{th}$ St. Apt. 4F, Brooklyn, NY (US) 11235

( * ) Notice: Subject to any disclaimer, the term of this patent is extended or adjusted under 35 U.S.C. 154(b) by 0 days.

(21) Appl. No.: 09/705,298

(22) Filed: Nov. 3, 2000

Related U.S. Application Data

(60) Provisional application No. 60/187,836, filed on Mar. 8, 2000.

(51) Int. Cl.$^7$ .............................................. G01R 23/16
(52) U.S. Cl. ................................ 324/76.51; 324/76.27; 324/633
(58) Field of Search .................................. 324/765, 629, 324/442, 76.27, 436, 763, 675, 677, 682, 655, 633, 76.51

(56) References Cited

U.S. PATENT DOCUMENTS

| | | | |
|---|---|---|---|
| 5,041,793 A | * | 8/1991 | Gailus .......................... 330/129 |
| 5,748,038 A | * | 5/1998 | Boscovic et al. ........... 330/129 |
| 6,211,663 B1 | * | 4/2001 | Moulthrop et al. ......... 324/615 |

* cited by examiner

*Primary Examiner*—N. Le
*Assistant Examiner*—Vincent Q. Nguyen
(74) *Attorney, Agent, or Firm*—Kevin Redmond

(57) ABSTRACT

A load pull circuit with a monitoring port which provides a constant VSWR throughout a phase variation in excess of 360°. The fundamental circuit comprises a fixed resistor of fifty ohms placed in series with an external fifty ohm load monitoring port resistor to ground. In parallel with the two series resistors, which total 100 ohms, is placed a 33.3 ohm resistor that is connected to ground through a series L-C circuit. The capacitance in the L-C circuit is adjustable and can be varied to cause the L-C circuit to change in net value from being inductive, to being resonant, and finally being capacitive. This causes the 33.3 ohm resistor to be connected to ground through an inductor, then through a short, and finally through a capacitor, making the load pull circuit present a load that vary through 360 degree in phase, while still remaining at a VSWR of 2:1. The inductor in the L-C circuit is a varactor, making the sweep through all 360° totally electronically controllable and simple to automate. This invention reduces the measurement time from typically 5 minutes to less than one second.

19 Claims, 2 Drawing Sheets

AUTOMATIC ELECTRONIC LOAD PULL CIRCUIT FOR OSCILLATORS

This application claims benefit of provisional application 60/187,836, filed Mar. 8, 2000.

BACKGROUND

1. Field

The present invention relates to load pull circuits with a monitoring port for electronic devices and more particularly to circuits of this type that may be automatically controlled.

2. Prior Art

Load pull circuits are used to test electronic devices such as amplifier and oscillators. They are designed to vary the load presented to a device through a range of different magnitudes and/or phases. The stability of an oscillator's frequency is monitored as the load pull is carried out. The stability under load pull conditions is normally specified for the device under test.

When a transmission line is terminated with an impedance, ZL, that is not equal to the characteristic impedance of the transmission line, ZO, not all of the incident power is absorbed by the termination. Part of the power is reflected back so that phase addition and subtraction of the incident and reflected waves creates a voltage standing wave pattern on the transmission line. The ratio of the maximum to minimum voltage is known as the Voltage Standing Wave Ratio (VSWR) and successive maxima and minima are spaced by 180° C. VSWR is calculated by the equation:

$$VSWR = \frac{Emax}{Emin}$$

In the equation, Emax is the maximum voltage on the standing wave and Emin is the minimum voltage on the standing wave.

Specifically, in testing oscillators, it is usually desired to keep the load pull VSWR constant and below a maximum value, such as 2:1, while changing the phase of the load through 360°. One way in which this can be done is by connecting a resistive load with a VSWR o 2:1 to one end of a variable length transmission line. However, there is often some mismatch occurring in the line as it is varied in length. This causes undesired variations in the signal level.

To overcome this problem, the arrangement shown in FIG. 1 may be used. In this Figure, a load pull port 1 is connected to one end of the two ends of a variable transmission line 3 by way of an attenuator 2. The variable transmission line is varied mechanically throughout its range with its remaining end left unterminated and then, to extend the range, the unterminated end of the line is shorted and the line is again mechanically varied through its range. The location of the attenuator before the transmission line tends to mask any mismatches or poor VSWR presented by the line while it is being varied. This arrangement also permits presenting a specified maximum VSWR to the port 1 simply by choosing an attenuator that will provide a specific loss, such as 5 dB of attenuation in the forward direction or 10 dB round trip to obtain a VSWR of 2:1.

Where a mechanically variable transmission line is used, it must be mechanically driven if it is to be automated. This is a costly, unreliable, and time consuming arrangement. If the operating frequency range is low, such as 1 to 2 MHz the variable line becomes too long to be practical. Both of these problems are overcome by the load pull circuit of the present invention described below which is a totally electronic, solid state load pull system, that provides greater frequency range, more mechanical compactness and greater reliability than can be obtained with other currently available systems.

SUMMARY

It is an object of the present invention to provide a load pull system that presents a load with at a constant VSWR magnitude over a 360° change in phase angle.

It is an object of the present invention to provide a load pull circuit that can be easily varied in VSWR magnitude by merely changing resistor values and can be easily varied in phase through a range of 360° by means of a control voltage.

It is an object of the present invention to make the magnitude of the VSWR provided by the load pull circuit independent of frequency.

It is an object of the present invention to produce the entire load pull circuit from lumped components or in IC form, making it possible to produce the circuit in compact form at frequencies as low as 1 to 2 MHz.

It is an object of the present invention to provide a load pull circuit that can function over an octave or more in frequencies by using multiple tuned circuits.

It is an object of the present invention to provide a monitoring port which provides a means for measuring frequency during the load pull test. The load pull circuit of the present invention provides a reflective phase range of 360°. The fundamental circuit comprises a fixed resistor of fifty ohms places in series with an external monitoring port fifty ohm load resistor to ground. In parallel with the two series resistor, which total 100 ohms, is placed a 33.3 ohm resistor that is connected to ground through a series L-C circuit. The capacitance in the L-C circuit is adjustable and can be varies to cause the L-C circuit to change in net value from being inductive, to being resonant, and then finally to being capacitive. This causes the 33.3 ohm resistor to be connected to ground through an inductor, a short, and finally a capacitor, making the load presented by the load pull circuit vary through 360 degree in phase, but remain at a VSWR of 2:1. The resistor values can be varied to produce a different VSWR.

The capacitor in the resonant circuit is a varactor, making the sweep through all 360° totally electronically controllable and automatic. The varactor is controlled by a saw tooth wave shape which varies from a low value such as 0.5 volts to a higher value such as 30 volts. The frequency range over which the load pull can operate is extended by adding additional inductor-varactor circuits in parallel. These circuits are adjusted to be resonant at different frequencies to extend the bandwidth of the load pull circuit.

DETAILED DESCRIPTION OF THE INVENTION

Figure 1:
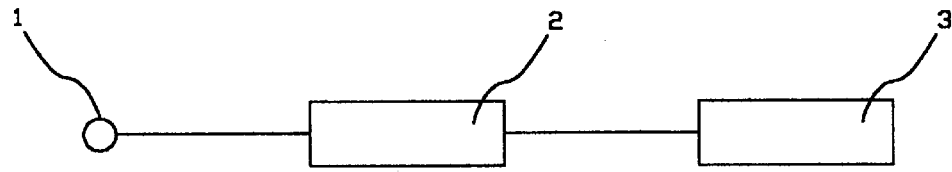
FIG. 1 is a block diagram of a prior art load pull circuit which includes an attenuator and a mechanically variable transmission line.
Figure 2:
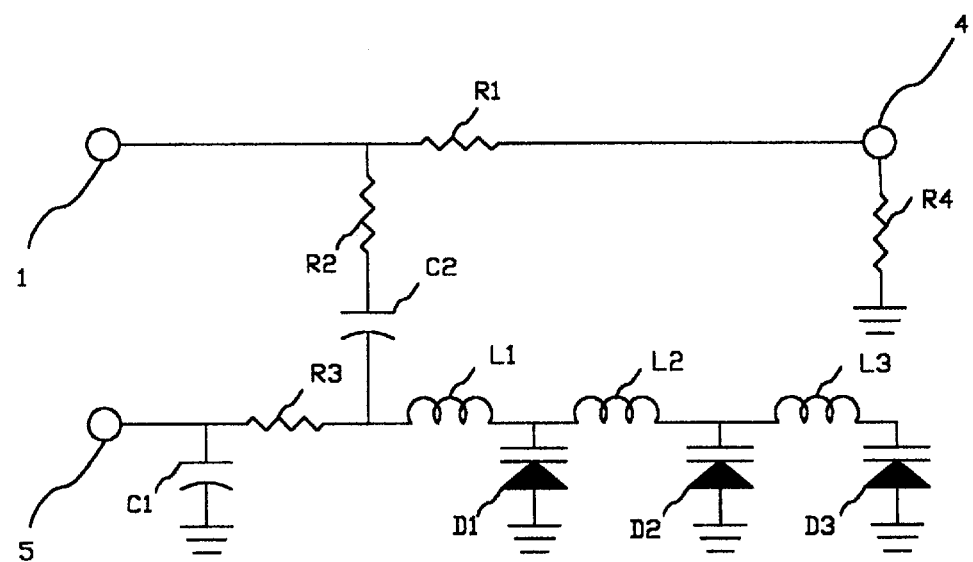
FIG. 2 is a schematic diagram of the present invention showing three L-C circuits used to extend the operating frequency range of the invention.

FIG. 2 is a schematic diagram of the present invention. The circuit in this Figure comprises a load pull impedance viewing port 1, a monitoring port 4, a first resistor $R_1$, a second resistor $R_2$, a third resistor $R_3$, a fourth resistor $R_4$, a first inductor $L_1$, a second inductor $L_2$, a third inductor $L_3$, a first capacitor $C_1$, a second capacitor $C_2$, a first varactor $D_1$, a second varactor $D_2$, and a third varactor $D_3$.

The circuit in FIG. 2 is connected to the device under test at port 1. The signal monitoring occurs at port 4 across the resistor $R_4$ which represents the load of the monitoring device. Port 1 is connected to port 4 via a resistor R1. In a 50 ohm circuit, $R_1$ and $R_4$ can both be 50 ohm resistors. A resistor $R_2$ is connected to port 1 and to ground via a DC blocking capacitor $C_2$ through 3 L-C circuits. The first L-C circuit is formed of the inductor $L_1$ and the varactor diode $D_1$. The second is formed from inductor $L_2$ and varactor $D_2$ and the third is formed from inductor $L_3$ and varactor $D_3$. $L_1$, $L_2$ and $L_3$ are all connected in series while diode $D_1$ is connected between $L_1$ and $L_2$ to ground, diode $D_2$ is connected between $L_2$ and $L_3$ to ground and diode $D_3$ is connected from the remaining end of inductor $L_3$ to ground. The control voltage port 5 is connected through $R_3$ to the junction of capacitor $C_2$ and inductor $L_1$. A voltage applied to the control voltage port 5 flows through $R_3$ and $L_1$ to the varactor $D_1$. This voltage also continues on through inductor $L_2$ to varactor $D_2$ and through $L_3$ to varactor $D_3$.

The control voltage applied to port 5 is applied to all three varactor simultaneously. The capacitor $C_1$, is connected between port 5 and ground. This capacitor in conjunction with the series resistor $R_3$ serves as an RF filtering circuit to eliminate any interaction between RF and the control voltage applied to port 5.

Figure 3:
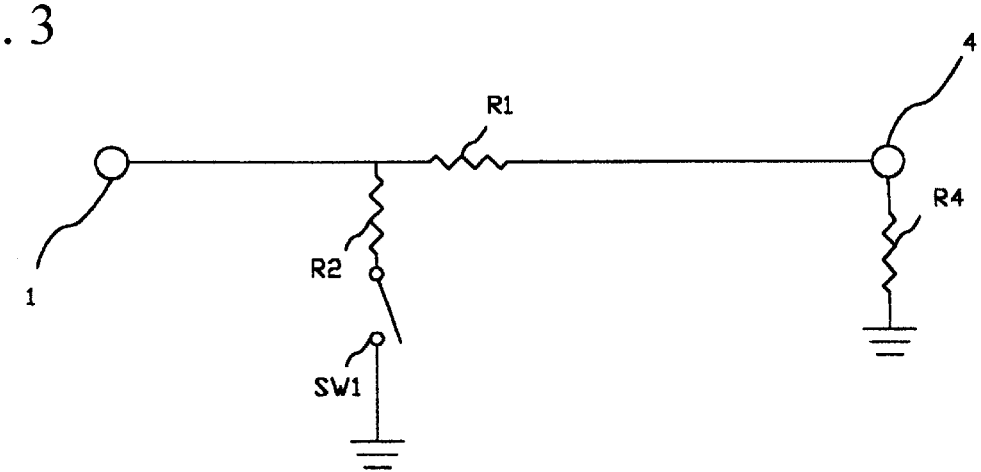
FIG. 3 is a simplified schematic diagram of the invention showing resistors $R_1$, and $R_2$ and a switch SW1 used to simulate the L-C circuits in FIG. 2. When an L-C circuit is at resonance the switch is closed. When the L-C circuit is far from resonance the switch is open.

FIG. 3 is a simplified schematic diagram representing the circuit of FIG. 2. In this Figure, port 1 is connected to port 4 through the resistor $R_1$. $R_2$ is also connected to port 1 while the other end of $R_2$ is connected to a single pole single throw switch SW-1. The opposite end of SW-1 is connected to ground. SW-1 symbolically represents the operation of an L-C circuit in FIG. 2, in that, when it is open, it represents the L-C circuit at a frequency far from resonance which is essentially an open circuit, and when SW-1 is closed, it represents the L-C circuit at resonance which is essentially a short circuit that connects the resistor R2 to ground.

In the operation of the circuit of FIG. 2, the resistor R2 is alternatively disconnected from ground and then connected to ground depending on whether or not any of the L-C circuits are tuned to resonance by the control voltage. Whenever one of these circuits is tuned to resonance, R2 is grounded. If R1 and R4 are each chosen to be 50 ohms, then a consistent voltage standing wave ratio (VSWR) of 2:1 is maintained. This can be seen by noting that when all of these circuits are far from resonance, R2 is essentially left ungrounded which causes this circuit to present at port 1 a total load of 100 ohms. In a 50 ohm circuit, the 100 ohms represents a VSWR of 2:1. The resistor R2 is 33.3 ohms, while the resistors R1 plus R4 combined are 100 ohms. Their parallel combination is 25 ohms. For a 50 ohm circuit with a load at R4, the alternate connection and disconnection of R2 to ground changes the impedance looking into port 1 from 100 ohms to 25 ohms. For a 50 ohms system this is a VSWR in either case of 2:1, however, the reflection changes 180 degrees.

The principal difference between FIGS. 2 and 3 is the use of the L-C circuits in FIG. 2 to provide the short to ground for $R_2$. The L-C circuits also provide another function. They cause the resistor $R_2$ to pass through a network which changes in phase as the control voltage on the varactor is changed. When an L-C circuit receives a signal from the oscillator that is at a frequency well below the resonance frequency of the L-C circuit, this circuit appears as a capacitance where its phase angle is −90°. At resonance the series L-C circuit appears as an RF short. At frequencies above resonance the series L-c circuit appears as an inductance where the phase angle is +90°. There is also a reversal in the phase angle of the impedance seen at port 1 when the load goes from twice the characteristic impedance to one half the characteristic impedance. The combination of the phase reversal and the change in phase due to the L-C circuits produces the 360° phase rotation of the load pull circuit.

The frequency range of the circuit of FIG. 2 is increased by the paralleling of the varactor-inductor circuits. For example, a circuit formed by $L_1$ and $D_1$ will resonate at a higher frequency. The circuit formed by the combination of $L_2$ and $D_2$ will resonate at a lower frequency, and finally the circuit formed by $L_3$ and $D_3$ will resonate at a still lower frequency. The use of these multiple resonant circuit increases the frequency range to typically cover an octave or more.

It is possible to produce resonant circuits of this type at 1 to 2 MHz, making it feasible to fabricate this type of system for use at such low frequencies; whereas; the length required for a variable line at these frequencies would be prohibitive as it would have to be in order of 500 feet in length.

Figure 4:
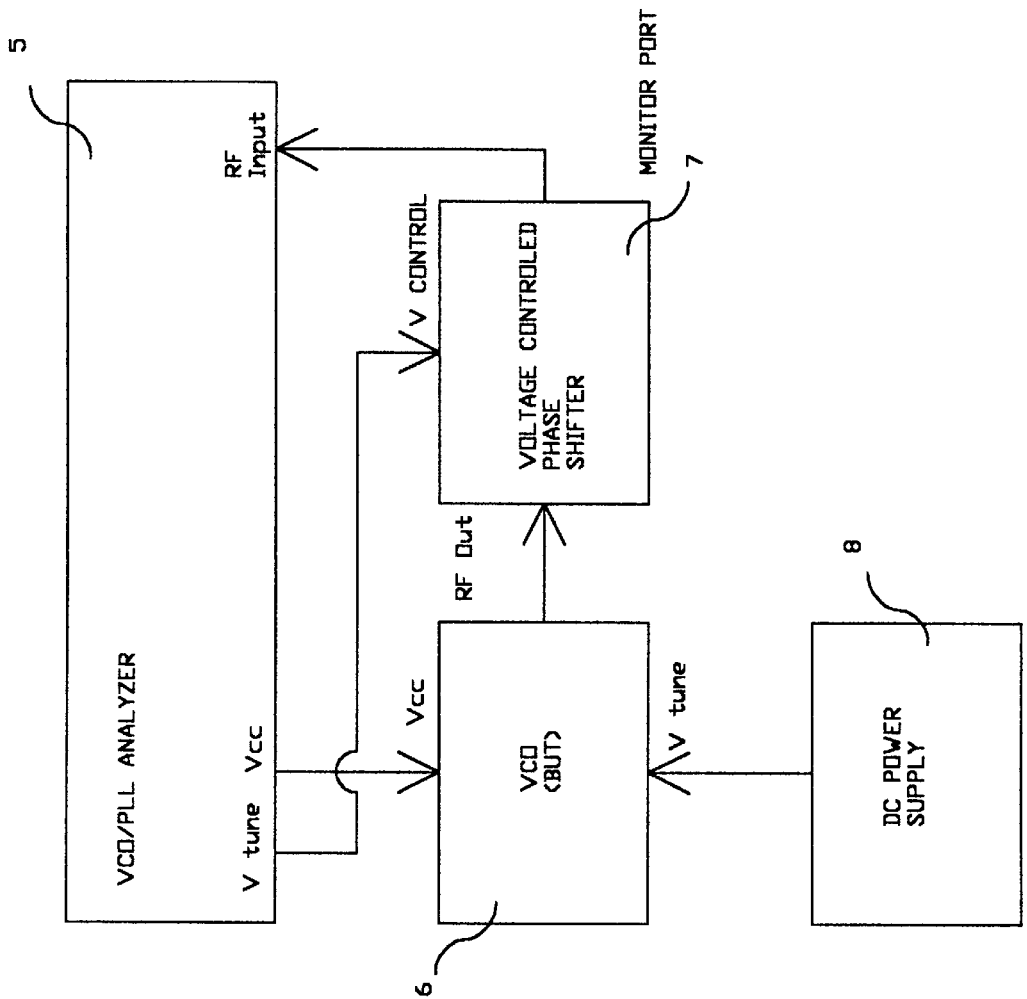
FIG. 4 is a block diagram of an automated load pull measurement test set up using HP4352 S, VCO/PLL analyzer and the present invention.

FIG. 4 is a block diagram of the automatic load pull measurement test set up which incorporates the present invention. This test set up comprises a VCO analyzer 5, a VCO (device under test(6, the present invention (a voltage controlled phase shifter) 7, and a DC power supply 8.

The VCO analyzer or monitoring device 5 includes three ports which are referred to as Vtune, Vcc, and RF input. The VCO or device under test (DUT) 6 includes three ports which are referred to as Vcc (supply voltage), Vtune (tuning voltage) and RF out (RF output signal). The voltage controlled phase shifter 7 includes three ports which are referred to as RF input, Vcontrol and the monitor port. These ports of the phase shifter 7 in FIG. 4 correspond to ports 1, 5 and 4 respectively of the phase shifter shown in FIG. 2.

In the operation of this set up, the frequency of the VCO is set by the voltage from the DC power supply. The RF output signal of the oscillator is fed to the phase shifter and then a portion of this signal is taken from the monitor port of the phase shifter and fed to the RF input port of the VCO analyzer. VCO analyzer is set to the frequency response measurement in analyzer mode.

The analyzer varies the V tune voltage to cause the phase shifter to vary the phase of the load in the phase shifter which causes the phase shifter to present a load to the oscillator that varies over 360°, but maintain the VSWR at 2:1. The VCO analyzer displays frequency as a function of control circuit voltage applied to a load pull. The use of the electronically variable shifter of the present invention markedly reduced the test time from 5 minutes to less than one second.

Having described my invention, I claim all of the objects in the summary section.

What is claimed is:

1. A load pull circuit for testing a device under test by a monitoring device comprising:

a) a voltage controlled phase shifter having a control port, a RIF input port, and a monitoring port;

b) the device under test having a supply voltage port, a tuning voltage port and a RF output port that provides an output signal, the RF output port connected to the RF input port of the voltage controlled phase shifter;

c) a dc power supply connected to the tuning voltage port of the device under test; and d) the monitoring device having a supply voltage port, a tuning voltage port and a RF input port, the supply voltage port of the device under test connected to the supply voltage port of the monitoring device, the monitoring port of said voltage controlled phase shifter is connected to the RF input port of the monitoring device, the tuning voltage port of the monitoring device connected to the control port of the voltage controlled phase shifter for applying a control voltage to the voltage controlled phase shifter, the voltage controlled phase shifter changing the phase of the output signal in response to the control voltage.

2. The load pull circuit according to claim 1, wherein the voltage controlled phase shifter comprises:

a) a first resistor connected between the RF input port and the monitoring port;

b) a second resistor having one end connected to the RF input port; and c) a series connected inductor and varacator, the inductor connected to the other end of the second resistor and the varacator having an end connected to a ground.

3. The load pull circuit according to claim 1, wherein phase of the output signal is swept through 360 degrees by the voltage controlled phase shifter.

4. The load pull circuit according to claim 3, wherein the control voltage applied to the control port is varied such that a voltage standing wave ratio of 2 to 1 is maintained as the phase is shifted through 360 degrees.

5. The load pull circuit according to claim 1, wherein the voltage controlled phase shifter comprises:

a) a first resistor connected between the RF input port and the monitoring port;

b) a second resistor having one end connected to the RF input port; and c) a first, second and third series connected inductor, the first inductor connected to the other end of the second resistor;

d) a first varactor connected between the first inductor, the second inductor and the ground;

e) a second varactor connected between the second inductor, the third inductor and the ground; and f) a third varactor connected between the third inductor and the ground.

6. The load pull circuit according to claim 5, wherein the voltage controlled phase shifter has a dc blocking capacitor connected between the second resistor and the control port.

7. The load pull circuit according to claim 6, wherein the voltage controlled phase shifter has a RF filter connected between the dc blocking capacitor and the control port.

8. The load pull circuit according to claim 7, wherein the RF filter is a third resistor connected to the dc blocking capacitor and a RF capacitor connected between the control port and the ground.

9. A load pull circuit comprising:

a) a monitoring device having a supply voltage port, a tuning voltage port and a RF input port;

b) a device under test having a supply voltage port, a tuning voltage port and a RF output port that provides an output signal;

c) a voltage controlled phase shifter means having a control port, a RF input port, and a monitoring port;

d) a dc power supply connected to the tuning voltage port of the device under test; and e) the RF output port of the device under test connected to the RF input port of the voltage controlled phase shifter means, the supply voltage port of the device under test connected to the supply voltage port of the monitoring device, the monitoring port connected to the RF input port of the monitoring device, the voltage tuning port of the monitoring device connected to the control port of the voltage controlled phase shifter means for applying a control voltage to the voltage controlled phase shifter means, the voltage controlled phase shifter means changing the phase of the output signal in response to the control voltage.

10. The load pull circuit according to claim 9, wherein the voltage controlled phase shifter means comprises:

a) a first resistor connected between the RF input port and the monitoring port;

b) a second resistor having one end connected to the RF input port;

c) a first, second and third series connected inductors, the first inductor connected to the other end of the second resistor;

d) a first varactor connected between the first inductor, the second inductor and the ground;

e) a second varactor connected between the second inductor, the third inductor and the ground; and f) a third varactor connected between the third inductor and the ground.

11. The load pull circuit according to claim 9, wherein the voltage standing wave ratio is varied by changing a resistance value of the first or second resistor.

12. A method of testing a device under test comprising:

a) providing a monitoring device, a voltage controlled phase shifter and a dc power supply;

b) connecting the device under test to the monitoring device, the voltage controlled phase shifter and the dc power supply;

c) generating an output signal from the device under test;

d) feeding the output signal to the voltage controlled phase shifter;

e) generating a modified output signal by the voltage controlled phase shifter;

f) feeding the modified output signal from the voltage controlled phase shifter to the monitoring device;

g) generating a control voltage by the monitoring device;

h) feeding the control voltage to the voltage controlled phase shifter;

i) to vary the control voltage such that the phase of the output signal in the voltage controlled phase shifter is changed.

13. The method of testing a device under test according to claim 12, wherein the device under test is an oscillator.

14. The method of testing a device under test according to claim 12, wherein the monitoring device is a vco analyzer.

15. The method of testing a device under test according to claim 12, wherein the phase is changed 360 degrees.

16. The method of testing a device under test according to claim 15, wherein the voltage standing wave ratio of the device under test is constant.

17. The method of testing a device under test according to claim 12, further comprising:

a) providing the monitoring device with a supply voltage port, a tuning voltage port and a RF input port; and b) providing the voltage controlled phase shifter with a control port, a RF input port, and a monitoring port, the tuning voltage port connected to the control port, the monitoring port connected to the RF input port and the tuning voltage port connected to the device under test, the output signal being fed to the RF input port of the voltage controlled phase shifter, the modified output signal being generated at the monitoring port and fed into the RF input port of the monitoring device, the control voltage being generated at the tuning voltage port and fed into the control port.

18. The method of testing a device under test according to claim 17, wherein the voltage controlled phase shifter includes:

a) a first resistor connected between the RF input port and the monitoring port;

b) a second resistor having one end connected to the RF input port; and c) at least one series connected inductor and varactor, the inductor connected to the other end of the second resistor and the varactor connected to a ground.

19. The method of testing a device under test according to claim 17, wherein the voltage controlled phase shifter includes:

a) a first resistor connected between the RF input port and the monitoring port;

b) a second resistor having one end connected to the RF input port;

c) a first, second and third series connected inductors, the first inductor connected to the other end of the second resistor;

d) a first varactor connected between the first inductor, the second inductor and the ground;

e) a second varactor connected between the second inductor, the third inductor and the ground; and f) a third varactor connected between the third inductor and the ground.

* * * * *